(12) United States Patent
Chandra et al.

(10) Patent No.: US 8,617,992 B2
(45) Date of Patent: *Dec. 31, 2013

(54) METHOD OF FORMING METAL SILICIDE CONTACT AND METAL INTERCONNECT

(75) Inventors: Aditi Chandra, Los Gatos, CA (US); Arvind Kamath, Los Altos, CA (US); James Montague Cleeves, Redwood City, CA (US); Joerg Rockenberger, San Jose, CA (US); Mao Takashima, Cupertino, CA (US); Erik Scher, San Francisco, CA (US)

(73) Assignee: Kovio, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/427,091

(22) Filed: Mar. 22, 2012

(65) Prior Publication Data

US 2012/0181636 A1 Jul. 19, 2012

Related U.S. Application Data

(62) Division of application No. 12/175,450, filed on Jul. 17, 2008, now Pat. No. 8,158,518.

(60) Provisional application No. 60/959,977, filed on Jul. 17, 2007.

(51) Int. Cl.
  *H01L 21/44* (2006.01)
(52) U.S. Cl.
  USPC ........... 438/682; 438/586; 438/664; 438/678; 438/683; 257/E21.593
(58) Field of Classification Search
  USPC .................. 438/682–683, 586, 664, 678, 674
  See application file for complete search history.

(56) References Cited

U.S. PATENT DOCUMENTS

| 5,342,806 A | 8/1994 | Asahina |
| 6,479,837 B1 | 11/2002 | Ogawa et al. |

(Continued)

FOREIGN PATENT DOCUMENTS

| JP | 1-136373 | 5/1989 |
| JP | 2-341 | 1/1990 |

(Continued)

OTHER PUBLICATIONS

Chinese Office Action dated Nov. 2, 2012; Chinese Patent Application No. 200880024999.6; 13 pages total; The State Intellectual Property Office of the P.R.C., People's Republic of China.

(Continued)

*Primary Examiner* — Thanh Nguyen
(74) *Attorney, Agent, or Firm* — Murabito, Hao & Barnes LLP; Andrew D. Fortney

(57) ABSTRACT

Methods of forming contacts (and optionally, local interconnects) using an ink comprising a silicide-forming metal, electrical devices such as diodes and/or transistors including such contacts and (optional) local interconnects, and methods for forming such devices are disclosed. Electrical devices, such as diodes and transistors may be made using such printed contact and/or local interconnects. A metal ink may be printed for contacts as well as for local interconnects at the same time, or in the alternative, the printed metal can act as a seed for electroless deposition of other metals if different metals are desired for the contact and the interconnect lines. This approach advantageously reduces the number of processing steps and does not necessarily require any etching.

29 Claims, 9 Drawing Sheets

(56) References Cited

U.S. PATENT DOCUMENTS

| | | | |
|---|---|---|---|
| 6,524,880 | B2 | 2/2003 | Moon et al. |
| 6,911,385 | B1 | 6/2005 | Haubrich et al. |
| 7,435,668 | B2 | 10/2008 | Machida et al. |
| 7,691,691 | B1 | 4/2010 | Cleeves |
| 7,977,240 | B1 * | 7/2011 | Rockenberger et al. ...... 438/674 |
| 8,158,518 | B2 * | 4/2012 | Chandra et al. ............... 438/682 |
| 2002/0153039 | A1 | 10/2002 | Moon et al. |
| 2005/0181566 | A1 | 8/2005 | Machida et al. |
| 2006/0105492 | A1 | 5/2006 | Veres et al. |
| 2006/0159899 | A1 | 7/2006 | Edwards et al. |
| 2006/0163744 | A1 | 7/2006 | Vanheusden et al. |
| 2006/0211187 | A1 | 9/2006 | Choi et al. |
| 2007/0107773 | A1 | 5/2007 | Fork et al. |
| 2007/0267628 | A1 | 11/2007 | Koo et al. |
| 2007/0287237 | A1 | 12/2007 | Rockenberger et al. |
| 2008/0038521 | A1 | 2/2008 | Robbins |

FOREIGN PATENT DOCUMENTS

| | | |
|---|---|---|
| JP | 2-224340 | 9/1990 |
| JP | 2000-22161 | 1/2000 |
| JP | 2005-260040 | 9/2005 |
| JP | 2007-139995 | 6/2007 |
| KR | 20020082094 A | 10/2002 |

OTHER PUBLICATIONS

PCT—International Search Report; International Appl. No. PCT/US 08/70389; Filing Date: Jul. 17, 2008; 3 pages; International Search Authority—U. S. Patent and Trademark Office.

PCT—Written Opinion of the International Search Authority; International Appl. No. PCT/US 08/70389; Filing Date: Jul. 17, 2008; 2 pages; International Search Authority—U. S. Patent and Trademark Office.

PCT International Preliminary Report on Patentability and Written Opinion; International Application No. PCT/US2008/070389; Dated Jan. 28, 2010; 7 pages; The International Bureau of WIPO, Geneva, Switzerland.

Extended European Search Report; European Patent Application No. 08796260.1; Dated Jun. 5, 2012; 10 pages; European Patent Office, Germany.

Kim Dong Seop, Lee Su Hong, Mun in Sik; "Method for Fabricating Solar Cell"; Espacenet; Korean Publication No. KR 20020082094 (A); Publication Date: Oct. 30, 2002; Espacenet Database—Worldwide; http://worldwide. espacenet.com/.

Kaneko, Toshiteru, et al.; Display Device and Its Manufacturing Method; Abstract of JP 2007139995; Jun. 7, 2007; http://focustj.wisdomain.biz/.

Machida, Akio, et al.; Doping Method, Method for Manufacturing Semiconductor Device and Electronic Application Device; Abstract of JP 2005260040; Sep. 22, 2005; http://focustj.wisdomain.biz/.

Hashizume, Tsutomu, et al.; Manufacture of Thin Film Transistor; Abstract of JP 02224340; Sep. 6, 1990; http://focustj.wisdomain.biz/.

Serikawa, Tadashi, et al.; Manufacture of Thin-Film Semiconductor Device; Abstract of JP 01136373; May 29, 1989; http://focustj.wisdomain.biz/.

Ogawa, Kazufumi, et al.; Thin-Film Transistor and Manufacturing Method Therefor; Abstract of JP 2000022161; Jan. 21, 2000; http://focustj.wisdomain.biz/.

Asahina, Michio; Semiconductor Device; Abstract of JP 02000341; Jan. 5, 1990; http://focustj.wisdomain.biz/.

* cited by examiner 5100
5200

5400
5300

5500

METHOD OF FORMING METAL SILICIDE CONTACT AND METAL INTERCONNECT

RELATED APPLICATIONS

This application is a divisional of U.S. patent application Ser. No. 12/175,450, filed on Jul. 17, 2008, now U.S. Pat. No. 8,158,518 pending, which claims the benefit of U.S. Provisional Application No. 60/959,977, filed Jul. 17, 2007, each of which is incorporated herein by reference in its entirety.

FIELD OF THE INVENTION

The present invention generally relates to the field of semiconductor devices and methods of manufacturing the same. More specifically, embodiments of the present invention pertain to methods of forming electrical contacts (and optionally, local interconnects) using a metal ink, electrical devices such as diodes and/or transistors including such contacts and (optional) local interconnects, and methods for forming such devices.

SUMMARY OF THE INVENTION

Aspects of the present invention relate to methods of forming contacts to doped or undoped silicon layers, and optionally forming local interconnects, in electronic devices using a metal ink. Other aspects relate to electrical devices (e.g., diodes, transistors, etc.) including such contacts and (optional) local interconnects, and to methods of making such devices. Generally, an ink including a silicide-forming metal (e.g., a metal precursor ink) can be printed, coated or selectively deposited on a (doped or undoped) silicon surface or substrate (e.g., exposed in a via or edge contact opening), as well as onto areas in which a local interconnect may be formed. The ink is then dried to remove solvent(s) and/or additives, thereby forming a silicide-forming metal precursor. A subsequent anneal in a reducing or inert atmosphere (e.g., either nitrogen or a forming gas, such as an $Ar/H_2$ mixture) cures the ink and allows for the reaction between the metal precursor and silicon to form a silicide while leaving the metal (e.g., other than the metal silicide contact) in other regions to form the local interconnect. In such a process, the non-silicided silicon (e.g., in a transistor channel) can be advantageously hydrogenated during the silicidation.

More specifically, in one aspect, a silicon contact and/or metal (or metal silicide) interconnect can be formed by selectively depositing an ink containing a metal that forms a silicide (hereinafter, a "metal precursor ink") onto an exposed silicon surface. Optionally, the silicon surface may further include a native oxide thereon. In a further option, the metal precursor ink may also be selectively deposited onto a dielectric (or other) layer adjacent to the exposed silicon surface to form a metal interconnect. Alternatively, a metal silicide interconnect can be formed on a patterned silicon surface. The metal precursor ink is then deposited (and optionally, selectively deposited) on the patterned silicon and annealed to form the silicide interconnect. When the ink is deposited to form a pattern, the pattern may correspond to that of a local or metal interconnect layer that is configured or adapted to electrically connect predetermined terminals of various devices to one another. The dielectric layer may comprise a (doped) glass formulation, in which the dopant may include B, P, As or other dopant in a sufficient concentration to diffuse the dopant into underlying silicon. The metal precursor ink is dried to form a silicide-forming metal precursor, and the metal precursor and silicon surface are heated to a predetermined temperature for a length of time sufficient to form a silicon contact (e.g., metal silicide). Optionally, the metal of the metal precursor remains on the dielectric regions, and a conductive metal may be selectively deposited (e.g., by plating) on the metal of the metal precursor. In general, forming the metal from the metal precursor occurs before selective deposition of the conductive metal, but silicide formation can be conducted at any time in this process (i.e., before forming the metal from the metal precursor, after forming the metal but before selective deposition of the conductive metal, or after selective deposition of the conductive metal).

In some embodiments, the silicide-forming metal may be deposited by printing an ink comprising a precursor of a silicide-forming metal in a solvent. Printable silicide-forming precursor formulations (e.g., metal precursor inks) and methods of forming such printable formulations are described in copending U.S. patent application Ser. No. 12/131,002, filed May 30, 2008, the relevant portions of which are incorporated herein by reference. In conventional processing, depositing a metal by sputter deposition or electron beam evaporation over a sharp step can cause breaks or discontinuities in the metal. However, in a printed process, extra ink can be placed at edges or corners, or other locations of possible thinning of the overlying layer, such that adequate material is present to prevent breakage or discontinuity of the overlying layer. Extra ink can be supplied in inkjet printing by placing extra drops of ink or larger drop volumes in the desired location(s). In gravure printing, the extra ink can be supplied using a larger cell volume on the drum. Moreover, additional ink can be printed for certain features intended for high current density flow (e.g., power busses, bond pads, clock signal lines, etc.) in order to avoid potential electromigration failure.

The metal precursor ink may be deposited by various coating or printing methods known in the art. Techniques for printing a liquid metal (precursor) ink are described in U.S. Pat. Nos. 7,152,804 and 7,314,513, and in copending U.S. patent application Ser. Nos. 10/616,147, 11/084,448 and 11/203,563 and, filed on Jul. 8, 2003, Mar. 18, 2005 and Aug. 11, 2005, respectively, the relevant portions of which are incorporated herein by reference. In various embodiments, the ink of the silicide-forming metal is deposited by inkjet printing. In certain embodiments, the pattern formed by the selectively deposited metal precursor ink has a thickness over the exposed silicon surface sufficient to form both the metal silicide and a non-silicided metal layer thereon, which remains over the metal silicide. In various implementations, the metal of the metal precursor ink is selected from the group consisting of Pd, Pt, Ni, Cr, Mo, W, Ru, Rh, Ti and alloys/mixtures thereof. Preferably, the metal is Pd.

Solvents and/or other additives in the metal precursor ink formulation are removed in a drying step to form a silicide-forming metal precursor (although certain additives may not be completely removed until heated or annealed under conditions sufficient to substantially completely remove such additives). The metal precursor and the silicon surface may then be heated (e.g., cured) in an inert atmosphere, which may further include a reducing gas, to form a metal silicide contact. Alternately or additionally, drying the ink and heating the silicide-forming precursor may form an interconnect and/or a metal seed layer on a dielectric layer adjacent to the exposed silicon surface. In a preferred embodiment, the heating step forms a metal silicide from a portion (or substantially the entire thickness) of the metal precursor above the silicon surface and at least a portion of the silicon layer below the silicon surface that is in contact with the metal precursor. The temperature range for heating the metal precursor is generally from about 100° C. to about 1000° C., and such heating may be conducted for a length of time from about 1 second to about 24 hours. If desired, the resistance of the metal silicide contact and the metal interconnect can be easily tuned by annealing in a different gas ambient (e.g., instead of annealing in forming gas, annealing in $N_2$, $O_2$, $N_2O$, NO, $O_3$, etc., alone or in combination). In this case, the resistance values are generally the same for all silicide contacts across an entire wafer or substrate surface. Similarly, the resistance values of all metal interconnects formed from the metal precursor ink are also generally the same across an entire wafer or substrate surface.

Optionally, different resistivities of the metal interconnect and the metal silicide contact can be achieved on a single substrate by altering the thickness of the printed metal. For example, thicker metal or more metal ink (achieved, for example, by increasing the number of drops, the drop volume or the ink volume, and/or decreasing the pitch between drops in a certain area) can be printed in areas where a lower resistance is desired. This technique has the marked advantage over conventional processing in that different thicknesses of material can be placed onto the substrate during the same processing step (e.g., printing). Optionally, the contact angle of the printed ink can be locally varied (for example, using a preprinting step, adapted to locally vary the surface energy of the substrate) so that different metal heights and line widths can be achieved with the same printing step.

In one variation, a smaller amount of metal (or thinner metal) can be printed onto areas intended for contacts, so that the metal does not consume the entire thickness of the silicon, while greater amounts of metal (thicker metal) can be printed for the interconnect to maintain a relatively low sheet resistance. Moreover, the contact resistance of source, drain, and/or gate contacts can be independently controlled by controlling the thickness of the metal printed in each region. If the silicidation anneal is performed so that the metal precursor is entirely consumed during the reaction with silicon, for a given contact area, the contact resistance is determined primarily or substantially entirely by the metal silicide thickness.

If preferred, the gate resistance of a polysilicon gate can be lowered by printing the metal precursor ink over the gate, and forming a silicide at the same time that the source and drain contacts are formed. In the same fashion, the gate resistance can be varied across a wafer by altering the thickness and/or pattern of the printed metal. Optionally, the polysilicon gate can be entirely converted to a metal silicide by printing the metal precursor with a thickness large enough to entirely consume the polysilicon during the silicidation reaction. In this fashion, multiple gate work functions on one substrate can be achieved with a single printing step.

In some implementations, a dielectric layer having one or more via holes therein may optionally be formed on the silicon layer prior to selectively depositing the ink of the silicide-forming metal. In preferred embodiments, the dielectric layer may comprise a spin-on doped glass formulation, as described in copending U.S. patent application Ser. No. 12/114,741, filed on May 2, 2008, the relevant portions of which are incorporated herein by reference. Moreover, if the metal precursor ink is deposited (e.g., by printing) immediately before or after the spin-on doped glass formulation is formed (e.g., printed), the dopant activation and the metal silicide formation process may be advantageously combined into a single annealing step.

In other implementations, a doped dielectric ink pattern may be printed onto a substrate, and a silicon feature (e.g., a silicon island) may be printed thereon. The metal precursor ink may be printed directly onto the silicon feature, then annealed to form a metal silicide contact as described above. The silicon feature can be subsequently doped by diffusing dopant from the doped dielectric ink into the silicon feature, preferably through its entire thickness, either in a separate annealing step or in the annealing step that forms the metal silicide. In either case, the metal silicide preferably does not consume the entire thickness of the silicon feature.

One important aspect of the present invention relates to the fabrication of a contact and a local interconnect in a single printing step using the metal precursor ink for both layers. This approach reduces the number of processing steps and does not require any etching steps. In the alternative, if different metals are desired for the contacts and the interconnect lines, a printed metal pattern (e.g., Pd) may be used as a seed layer for electroless deposition or electroplating of other metals (e.g., Ag, Cu, Ni, etc.), as well as for forming a metal silicide (e.g., $Pd_2Si$) in the contact areas. The thickness of the metal and the curing process to form the silicide may be chosen or determined such that all of the metal in the contact area is not consumed, while good silicide contacts are still formed. Additional metal may be plated onto the metal seed layer and/or onto the metal silicide, in the interconnect areas and/or in the contact areas. An additional annealing step (e.g., post-plating) may further improve the electrical contact between the silicide and the plated metal. In this process, the printed and cured metal precursor film (e.g., to form the metal and metal silicide layers) does not have to be continuous. Additionally, a cleaning and/or roughening step, applied to the dielectric layer prior to printing the metal precursor ink, can improve the adhesion of the plated metal to the dielectric layer.

In various embodiments, a bulk conductive metal may be selectively deposited on any metal remaining after printing, drying and annealing the metal precursor ink. The bulk conductive metal may be deposited by plating the bulk conductive metal onto the remaining metal (i.e., from the ink). Plating the bulk conductive metal may comprise either electroless plating or electroplating, and the bulk conductive metal may be selected from the group consisting of Al, Ag, Au, Cu, Pd, Pt, Ni, Cr, Mo, W, Ru, Rh, and alloys and/or mixtures thereof. In some embodiments, the bulk conductive metal may be plated before or after silicide formation. In further embodiments, the bulk conductive metal may be further annealed (optionally, in the same step as silicide formation) to improve one or more physical and/or electrical characteristics of the bulk conductive metal.

In further embodiments, the exposed silicon surface may be altered (e.g., cleaned) prior to depositing the silicide-forming metal ink. In other embodiments, the exposed silicon surface, including any native oxide thereon if present, and the dielectric layer may be etched prior to selectively depositing the metal precursor ink. In another variation, the surface energy of the exposed silicon surface and/or the dielectric layer may be modified prior to selectively depositing the precursor ink. Naturally, the method(s) may further include forming a silicon layer on the substrate, to thereby provide the exposed silicon surface.

The present invention also relates to a method of making an electrical device such as a transistor by first forming a patterned doped dielectric on a substrate, where the patterned doped dielectric contains a dopant. Patterned (e.g., printed) thin film transistor structures and methods of making the same are described in copending U.S. patent application Ser. Nos. 11/452,108, 11/818,078, 11/888,942, 11/888,949, and 11/842,884, filed on Jun. 12, 2006, Jun. 12, 2007, Aug. 3, 2007, Aug. 3, 2007, and Aug. 21, 2007, respectively, the relevant portions of which are incorporated herein by reference. After forming the patterned doped dielectric, a semiconductor layer is formed on at least part of adjacent structures in the patterned doped dielectric and in a gap that is present between the adjacent structures. A gate dielectric is then formed on the semiconductor layer at least over the gap, and the dopant is diffused into regions of the semiconductor layer within a diffusion distance of the patterned doped dielectric. A gate is then formed on the gate dielectric. Optionally, the dopant may be diffused into the semiconductor layer before the gate dielectric is formed. Thereafter, the method of forming metal silicide contacts (and optionally, metal interconnects) may be performed to form the electrical device.

Further aspects of the present invention relate to other electrical devices (such as diodes) and methods for making the same. In one general embodiment, a diode (or other electrical device, such as a capacitor, resistor, or transistor) may comprise a substrate having a silicon surface and a metal silicide layer as at least part of the silicon surface. A metal seed layer, continuous with the metal silicide layer, is formed on or over the substrate in a pattern (e.g., in the pattern of an interconnect layer). In some embodiments, a dielectric layer (which may be doped, as described herein) may be present on the substrate, adjacent to the silicon surface, and onto which the seed layer may be formed. A conductive metal may be plated on the metal silicide layer and the metal seed layer to form a bulk conductive metal layer (e.g., the interconnect). When the interconnect connects a source/drain terminal of a transistor to the gate of the transistor, the device thus formed is generally a diode. When the interconnect connects the two source/drain terminals of a transistor to each other, the device thus formed is generally a capacitor. When the interconnect connects one source/drain terminal of a transistor to an input signal, the other source/drain terminal of a transistor to an output signal, and the gate of the transistor to a power supply or constant/reference voltage, the device thus formed is generally a resistor.

In a second general embodiment, the diode (or other device) has a gate on (or over) a gate dielectric on a silicon surface of a substrate. A patterned, doped dielectric containing a dopant may be present in regions over the silicon layer or feature providing the silicon surface, and may be substantially absent in regions exposing the silicon surface. This device also has a metal silicide layer on the gate and on at least part of a source/drain terminal in (or on) the silicon surface. A metal interconnect or seed layer is on (or over) the substrate, continuous with both the metal silicide layer on the gate and the metal silicide layer on at least part of a source/drain terminal, thereby forming the diode in the metal interconnect case. Plating a bulk conductive layer on the metal seed layer (as described herein) also forms the diode. Other variations (e.g., as described in the preceding paragraph and as is within the capability of one skilled in the art) to form other devices are also contemplated.

The above described diodes and electrical devices, and variations thereof, may also be made by forming a gate dielectric on an exposed silicon surface on a substrate, and then forming a gate on the gate dielectric. Next, a patterned doped dielectric can be formed on at least parts of the silicon surface (which may be exposed or which may have an exposed portion of the gate dielectric thereon), and the dopant is diffused into regions of the silicon within a diffusion distance of the patterned, doped dielectric. An ink comprising a silicide-forming metal is printed on at least exposed (doped or undoped) portions of the silicon surface. The metal precursor ink is subsequently dried to form a silicide-forming metal precursor. The metal precursor and the silicon surface in contact therewith are heated sufficiently to form a metal silicide layer, before or after forming a metal film or layer from the metal precursor. In fact, forming a metal film or layer from the metal precursor is not necessary if a local interconnect is not made. In one variation, the patterned doped dielectric comprises a doped spin-on dielectric, having spaces or openings therein for one or more metal silicide-containing straps to connect the gate to the doped or undoped regions of the silicon. Furthermore, various implementations may further include forming a metal seed layer on or over the substrate, where the metal seed layer is continuous with the metal silicide layer. In such embodiments, the metal seed layer and/or the metal precursor ink preferably comprise Pd.

In another aspect of the present invention, an electrical device is disclosed. Generally, the electrical device comprises a substrate having a silicon surface thereon, a dielectric material having a via hole therein on the substrate exposing a part of the silicon surface, a metal silicide layer in the via hole on the exposed part of the silicon surface, and a metal seed layer on the dielectric material, which is continuous with the metal silicide layer and is in a pattern of an interconnect. The device may further have a conductive metal plated on the metal silicide layer and the metal seed layer, which forms the interconnect. In various embodiments, the metal seed layer is selected from the group consisting of Pd, Pt, Ni, Cr, Mo, W, Ru, Rh, Ti, and alloys and mixtures thereof, and the metal seed layer may be printed on the dielectric material. In various embodiments, the conductive metal is selected from the group consisting of Al, Ag, Au, Cu, Pd, Pt, Ni, Cr, Mo, W, Ru, Rh, and alloys thereof.

In exemplary embodiments, an ink comprising a silicide-forming metal may be printed on exposed (doped or undoped) portions of the semiconductor layer. After drying the ink to form a silicide-forming metal precursor, the metal precursor and the silicon surface contacting the precursor may be heated sufficiently to form a metal silicide layer. In some variations, a metal interconnect precursor can be printed from the silicide-forming metal ink on regions of the substrate adjacent to and continuous with the portions of the semiconductor layer that form the metal silicide layer, or in the alternative, a metal interconnect may be plated on the metal silicide layer and a metal formed from the metal interconnect precursor.

The present invention provides a method of making contacts to silicon layers (and optionally, local interconnects) in electronic devices by the formation of a silicide from a metal precursor ink. The present invention also provides electronic devices such as diodes and transistors that include such contacts and/or local interconnects, and methods of forming such devices. By printing an ink containing a silicide-forming metal to form contacts and local interconnects at the same time, the number of processing steps may be reduced, and the need for etching may be reduced or eliminated. These and other advantages of the present invention will become readily apparent from the detailed description of preferred embodiments below.

DETAILED DESCRIPTION OF THE PREFERRED EMBODIMENTS

Figure 1A:
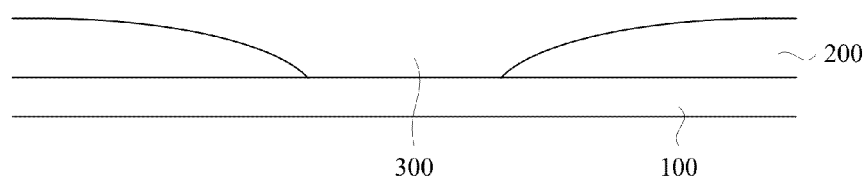
FIGS. 1A-1C are cross-sectional views showing formation of a metal silicide contact according to the present invention.

Reference will now be made in detail to the preferred embodiments of the invention. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention. Furthermore, it should be understood that the possible permutations and combinations described herein are not meant to limit the invention. Specifically, variations that are not inconsistent may be mixed and matched as desired.

In the present invention, the term "deposit" (and grammatical variations thereof) is intended to encompass all forms of deposition, including blanket deposition (e.g., CVD and PVD), (spin) coating, and printing. In various embodiments of the method of printing a metal-containing ink on a substrate, printing may comprise inkjetting, gravure printing, offset printing, flexographic printing, spray-coating, slit coating, extrusion coating, meniscus coating, microspotting and/or pen-coating the metal formulation onto the substrate. Also, for convenience and simplicity, the terms "part," "portion," and "region" may be used interchangeably but these terms are also generally given their art-recognized meanings. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use. In addition, the term "(doped)" refers to a material that is doped or undoped.

For the sake of convenience and simplicity, the terms "coupled to," "connected to," and "in communication with" (and variations thereof) mean direct or indirect coupling, connection or communication, unless the context clearly indicates otherwise. These terms are generally used interchangeably herein, and wherever one such term is used, it also encompasses the other terms, unless the context clearly indicates otherwise. Furthermore, with regard to certain materials, the phrase "consisting essentially of" does not exclude intentionally added dopants, which may give the material to which the dopant is added (or the structure or feature formed from such material) certain desired (and potentially quite different) physical and/or electrical properties.

The term "(cyclo)silane" refers to compounds or mixtures of compounds that consist essentially of (1) silicon and/or germanium and (2) hydrogen, and that may contain one or more cyclic rings. The term "hetero(cyclo)silane" refers to compounds or mixtures of compounds that consist essentially of (1) silicon and/or germanium, (2) hydrogen, and (3) dopant atoms such as B, P, As or Sb that may be substituted by a conventional hydrocarbon, silane or germane substituent and that may contain one or more cyclic rings. Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes [generally the length and width]). Furthermore, the terms "metal precursor ink", "precursor ink," "metal ink," and "ink" may be used interchangeably to refer to an ink of a silicide-forming metal. The terms "metal precursor" and/or "precursor" may be used interchangeably to refer to a silicide-forming metal precursor. Examples of electrical devices that may be made according to the various embodiments of the present invention include, but are not limited to transistors, diodes, capacitors, inductors and resistors.

In the present invention, it is particularly advantageous to use palladium as the silicide-forming metal, because palladium silicides may be formed even in the presence of a native or chemical oxide that may be present on a silicon surface. This is important for forming structures such as ohmic contacts between (doped or undoped) silicon and interconnect metals, where native or chemical oxides formed on the silicon surface could interfere and result in insufficient conductivity and/or reduced performance of the contact.

Embodiments of the present invention provide the advantage of depositing (e.g., printing) a metal ink for contacts and/or local interconnects in a single printing step. This reduces the number of depositing and other processing steps typically required by methods known in the art. Furthermore, many embodiments of the present invention do not require etching, which can alleviate a significant amount of the waste that occurs when relatively expensive materials are etched away.

The invention, in its various aspects, will be explained in greater detail below with regard to exemplary embodiments.

Exemplary Methods of Making a Silicon Contact and/or Interconnect

Figure 1B:
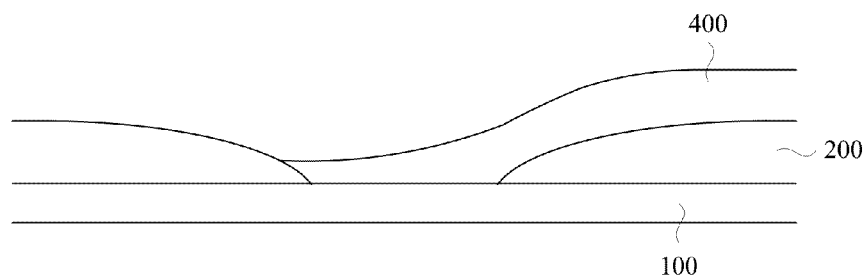
Figure 1C:
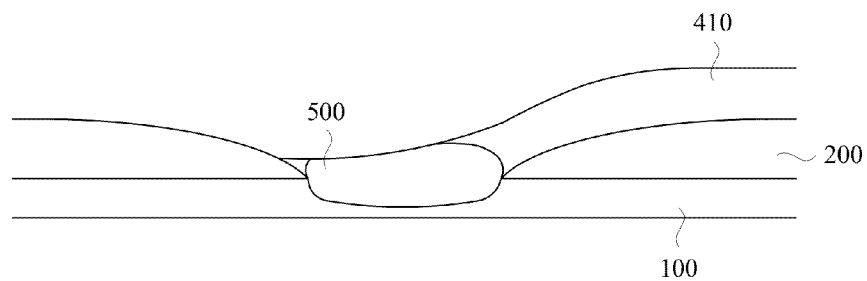

A first aspect of the present invention relates to a method of making a silicon contact and/or interconnect. FIGS. 1A-1C illustrate an exemplary method for forming a silicon contact. FIG. 1A shows a silicon surface 100 with portions exposed (e.g., by forming via or contact holes 300 in dielectric layer 200). A metal precursor ink (e.g., comprising a precursor of a silicide-forming metal) is selectively deposited onto the exposed silicon surface 100 and dielectric layer 200. In a preferred embodiment, selective deposition comprises printing (e.g., inkjet printing). Optionally, the ink can be printed primarily on the exposed silicon surface 100, overlapping with only a relatively small adjacent area of the dielectric layer 200.

In general, the metal precursor ink formulation may consist essentially of a Group 4, 5, 6, 7, 8, 9, 10, 11, or 12 metal salt or metal complex, one or more solvents adapted to facilitate coating and/or printing of the formulation, and optionally, one or more additives that form gaseous or volatile byproducts upon reduction of the metal salt or metal complex to an elemental metal or alloy thereof (see, e.g., copending U.S. patent application Ser. No. 12/131,002, filed May 30, 2008, the relevant portions of which are incorporated herewith by reference). In various implementations, the silicide-forming metal is selected from the group consisting of Pd, Pt, Ni, Cr, Mo, W, Ru, Rh, Ti and alloys or mixtures thereof. In preferred embodiments, the silicide-forming metal comprises or consists essentially of Pd. For example, a Pd ink may be printed onto or over the exposed silicon surface, and then annealed to form transistor contacts. Optionally, the metal from the reduced metal precursor can form a local interconnect or a seed layer for plating a bulk metal interconnect, thereby facilitating formation of electrical connections between terminals of the same of different devices in a single printing or patterning step. In such embodiments, the metal precursor ink may further comprise a bulk conductor precursor, such as metal nanoparticles (e.g., Ag) and/or one or more metal salts, metal oxides and/or metal complexes (see, e.g., U.S. Pat. Nos. 6,878,184, 7,084,276, 7,259,100, 7,259,101, and 7,294,449, and co-pending U.S. patent application Ser. Nos. 11/452,108, 11/818,078, 11/888,942, 11/888,949, 11/842,884 and 12/131,002, filed Jun. 12, 2006, Jun. 12, 2007, Aug. 3, 2007, Aug. 3, 2007, Aug. 21, 2007, and May 30, 2008, respectively, the relevant portions of which are incorporated herewith by reference).

The metal precursor ink is then dried to remove any solvent(s) and/or additives present in the formulation to form a metal precursor pattern 400 as shown in FIG. 1B. In an exemplary embodiment, the drying process comprises heating the coated or printed metal precursor ink to a temperature and/or for a length of time sufficient to remove substantially all of the solvent(s). In other embodiments, drying comprises removing the solvent(s) in a vacuum, with or without applied heat. In any such embodiments, the temperature may be from 30° C. to 300° C., 50° C. to 200° C., or any value or range of values therein. The length of time may be sufficient to remove substantially all of the solvent and/or substantially all of the additive(s) from the coated or printed metal precursor ink (e.g., from 1 second to 4 hours, 1 minute to 120 minutes, or any other range of values therein). The vacuum may be from 1 mtorr to 300 torr, 100 mtorr to 100 torr, 1-20 torr, or any other range of values therein, and may be applied by vacuum pump, aspirator, venturi tube, etc.

After drying, the silicide-forming metal precursor may be reduced to form a metal layer from the dried metal precursor (e.g., layer 410 in FIG. 1C). For example, the metal-containing precursor film may be exposed to a reducing agent and heated at a temperature ranging from greater than ambient temperature to about 100-400° C., depending on the metal precursor and/or substrate. Details of various methods to reduce the metal precursor are described in copending U.S. patent application Ser. No. 12/131,002, filed May 30, 2008, the relevant portions of which are incorporated herewith by reference. However, the metal precursor need not be reduced, if an interconnect is not formed. The same or similar solvent for the metal precursor ink may selectively remove unreacted metal precursor from the metal silicide when the metal precursor is not reduced.

The silicide-forming metal precursor (or metal, if the metal precursor is reduced first) and silicon surface are then heated to a first temperature for a length of time sufficient to form a silicon contact (e.g., metal silicide) 500, as shown in FIG. 1C. In some embodiments, a native oxide (not shown) may be on the exposed silicon surface prior to selective deposition of the ink. In various embodiments, a bulk conductive metal (not shown) may be selectively deposited by electro- or electroless plating on the reduced metal 410 from the metal precursor ink, which provides a seed layer for forming a metal interconnect from the bulk conductive metal.

In exemplary embodiments, the step of depositing the silicide-forming metal comprises printing an ink comprising a precursor of the silicide-forming metal in a solvent. Printable silicide-forming precursor formulations (e.g., metal precursor ink) and methods of forming such printable formulations are described in co-pending U.S. patent application Ser. No. 12/131,002, filed May 30, 2008. Printing may comprise inkjetting, gravure-, offset-, screen-, or flexo-printing, spray-coating, slit coating, extrusion coating, meniscus coating, microspotting and/or pen-coating the metal formulation onto the substrate. However, inkjet printing is preferred.

FIG. 1A shows a via hole or opening 300 in the dielectric layer 200 where the silicon surface 100 is exposed, into which the ink may be printed. In some embodiments, the ink is also printed onto the dielectric layer 200 in a pattern corresponding to that of an interconnect. In one example, the interconnect is a local interconnect, which may electrically connect one or more terminals of a first device to one or more terminals of the same device or an adjacent device. The via hole or opening may have a width of from about 1 micron to about 100 microns, or any width or other range of widths therein. In preferred embodiments, the via hole width ranges from about 2 microns to about 50 microns.

For certain embodiments in which only metal silicide contacts are desired, the metal precursor ink is printed only in predetermined areas of exposed silicon. Selective wetting of the exposed silicon surface (e.g., relative to surface[s] of other materials surrounding the silicon) may be accomplished using a process that changes the relative surface energy of the surrounding surface(s). In one example, the exposed silicon surface and if present, any native oxide thereon, may be etched in an etch solution comprising aqueous HF prior to selectively depositing the metal precursor ink. Preferably, the etch solution comprises dilute aqueous HF, or in the alternative, a buffered oxide etch solution (e.g., aqueous HF/NH$_4$F). By etching the substrate surface in dilute, concentrated and/or buffered aqueous HF, the surface energy of the exposed silicon may be altered, and the metal precursor ink can preferentially wet the exposed silicon areas (e.g., on a silicon island and gate), leaving the non-modified regions (e.g., the dielectric layer and any field oxide) substantially uncovered. This method of preferential wetting allows for the metal precursor ink (e.g., a Pd-containing ink, as disclosed in co-pending U.S. patent application Ser. No. 12/131,002, filed May 30, 2008, the relevant portions of which are incorporated herein by reference) to cover exposed silicon surfaces, guaranteeing that the metal will be in contact with silicon (e.g., doped silicon where the doping source is an adjacent dielectric material containing a dopant).

In a second example, the substrate surface may be modified by a plasma treatment using a combination of a fluorocarbon (e.g., $CF_4$, $C_2F_6$, etc.) and oxygen (e.g., $O_2$, $O_3$, $NO_2$) gases, for example for a length of time sufficient to selectively change the surface energy of one exposed surface relative to another (e.g., silicon relative to oxide[s]). This plasma treatment also results in preferential wetting of the exposed silicon areas. This method for forming contacts (e.g., by preferential wetting) is unaffected by the doping level of the underlying silicon, and may therefore be advantageous over electroless deposition, which may be challenging when the underlying silicon is undoped or has a relatively low doping level. It should also be noted that this preferential wetting method allows for relaxed constraints on printing alignment and overlays. In this process flow, a metal ink for interconnects (such as Ag) can be printed over the metal from the metal precursor ink, and the silicidation and metal ink curing step can be combined into one annealing step.

In alternate embodiments, and as discussed in part above, the surface energy of the exposed silicon surface and/or the dielectric layer may be modified prior to selectively depositing the metal precursor ink. Such surface energy modification may comprise treating the exposed silicon surface and/or the dielectric layer with a surface energy modifying agent. The particular agent and/or composition used for substrate modification can be tailored to the surface being modified. For example, silazanes such as hexamethyldisilazane (HMDS) and silyl halides such as trimethylsilyl chloride can react with and modify Si or $SiO_x$ surfaces. In some variations, only the dielectric layer is treated with the surface energy modifying agent, while in others both the exposed silicon surface and the dielectric layer are treated. In one preferred embodiment, the agent for modifying the surface energy of the dielectric (and for removing native oxide from silicon surfaces) comprises aqueous HF. In another preferred embodiment (see the preceding paragraph), the substrate surface is modified (or further modified) by plasma treatment using $CF_4$ and $O_2$.

Alternatively or additionally, the exposed silicon surface can be cleaned prior to depositing the ink of a silicide-forming metal. Such a process can result in low contact angles of the metal precursor ink on the silicon surface (e.g., as low as 0 degrees). In exemplary embodiments, cleaning is accomplished by treating the silicon surface with an acid (e.g., aqueous HF or $H_2SO_4$), rinsing the substrate with water, and/or drying the substrate. The washing, rinsing and/or drying steps may be performed at a predetermined temperature and for a predetermined length of time. For example, a silicon or silicon-oxide surface can be cleaned with aqueous $H_2O_2$ or a concentrated aqueous $H_2SO_4/H_2O_2$ solution for about 10 minutes. Optionally, the concentrated aqueous $H_2SO_4/H_2O_2$ treatment step can be followed by an aqueous $H_2O_2$ cleaning process for 10 minutes.

Medium contact angles (e.g., between 5 and 30 degrees) can be created by starting with an HMDS coated surface (e.g., prepared by evaporating an HMDS coating onto a cleaned silicon and/or silicon oxide surface), and then reducing the HMDS coverage by controlled UV/ozone treatment for a predetermined time and at a predetermined UV power. In the alternative, a controlled $O_2$/plasma treatment may be used for a predetermined time and at a predetermined RF power. Another method for partially or fully removing HMDS includes a treating the HMDS coated surface with a high-temperature bath of $H_2O_2$ and $H_2SO_4$ for a predetermined time. These examples are not limiting and may be adapted as needed to the surface energy modification processes and surface treatment steps.

In various embodiments, the printed and cured metal precursor film (e.g., metal and/or metal silicide films) can be discontinuous or agglomerated if formed during a high temperature anneal step (e.g., at a temperature greater than 650° C. in forming gas). If a discontinuous silicide is used for forming edge contacts, the metal interconnect that is printed over the silicide must also be printed adjacent to (or in contact with) the spin-on dopant (SOD) edge. This is to ensure that the metal line is in contact with silicide that is above doped silicon (where the doping occurs from the SOD).

Figure 2A:
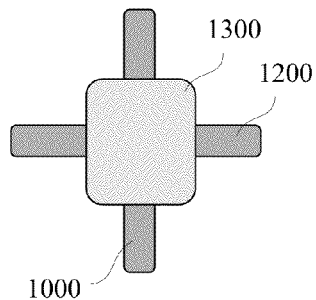
FIGS. 2A-2E are top-down views showing a method for forming metal contacts and/or interconnects when the printed and cured metal precursor film is discontinuous.
Figure 2B:
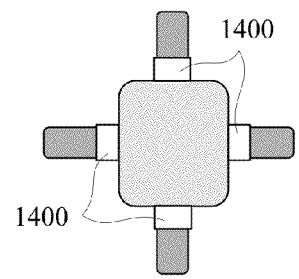

FIGS. 2A-2D show an exemplary embodiment where the metal silicide layer is discontinuous. In FIG. 2A, a silicon island 1000 is printed on a substrate, and a gate dielectric (not shown) is formed thereover, generally by thermal oxidation, but alternatively by printing a gate dielectric precursor ink thereover (see, e.g., copending U.S. patent application Ser. Nos. 11/084,448 and 11/203,563, filed on Mar. 18, 2005 and Aug. 11, 2005, respectively, the relevant portions of which are incorporated herein by reference). In addition, the gate dielectric can be deposited by CVD methods known in the art (e.g., PECVD, HDPCVD, etc.). A silicon gate 1200 is printed on or over the gate dielectric. A spin-on dopant 1300 is subsequently printed thereon, including in any area of the crossover between the silicon island 1000 and the silicon gate 1200, but the ends of the silicon island 1000 and the silicon gate 1200 are left uncovered. Thereafter, the spin-on dopant 1300 is dried and cured. Next, the silicon gate 1200 and silicon island 1000 in contact with and within a diffusion distance of the spin-on dopant 1300 are doped by annealing the spin-on dopant 1300. The resulting regions of exposed, doped silicon 1400 (i.e., within a diffusion distance of the spin-on dopant 1300) are illustrated in FIG. 2B.

Figure 2C:
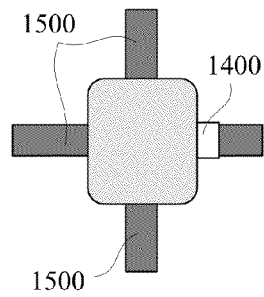
Figure 2D:
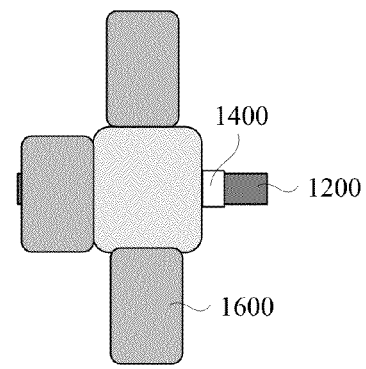
Figure 2E:
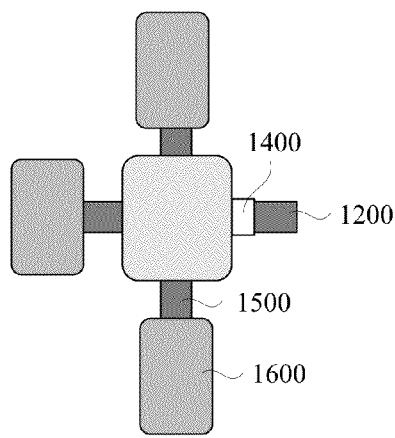

A metal precursor ink (e.g., containing a precursor of a silicide-forming metal) is selectively deposited (e.g., by printing) on the exposed ends of the silicon gate 1200 and silicon island 1000, including the regions of doped silicon 1400, preferably following surface energy modification of the exposed silicon surfaces and/or the dielectric layer 1300. The metal precursor ink is dried and (if necessary) reduced to form a silicide-forming metal on the ends of the silicon gate 1200 and silicon island 1000, then the silicide-forming metal is annealed to form a metal silicide 1500, as illustrated in FIG. 2C. When the metal silicide contacts 1500 are formed at the edges of a doped dielectric layer, they may be termed "edge" contacts. A conductive metal interconnect 1600 is formed on the metal silicide 1500, adjacent to (or in contact with or slightly overlapping) the spin-on dopant edge, as shown in FIG. 2D. This ensures the maximum contact between metal silicide contacts 1500 and metal contact pads (or ends of interconnects) 1600. In certain embodiments where the metal silicide is discontinuous, it is necessary to print the interconnect up to the doped dielectric edge, as illustrated in FIG. 2D. Alternatively, the metal pad/interconnect 1600 may be offset from the spin-on dopant edge, but in contact with substantially all of a peripheral surface of a silicided, patterned silicon feature as shown in FIG. 2E. If either continuous or discontinuous silicide is formed in an opening in the spin-on dopant or other dielectric layer (as opposed to the edge contacts shown in FIGS. 2D and 2E), the metal pad/interconnect can simply be printed above the contact, ensuring that the via hole is completely covered with interconnect metal. Such an embodiment and variations thereof are discussed below in greater detail with regard to exemplary electrical devices (see also FIGS. 7A and 7B).

Figure 3A:
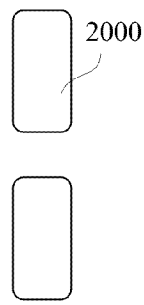
FIGS. 3A-3D are top-down views showing a method of forming metal contacts when the metal silicide is (optionally) agglomerated and forms a contact, and the silicon is doped from below.
Figure 3B:
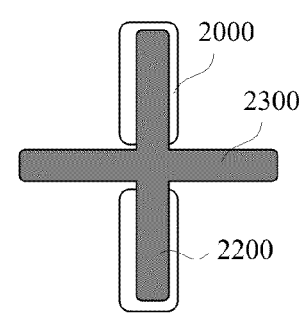
Figure 3C:
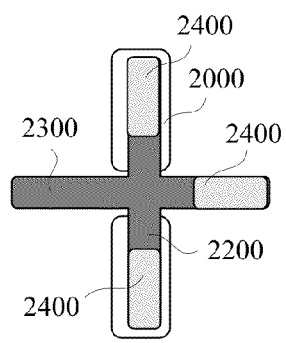
Figure 3D:
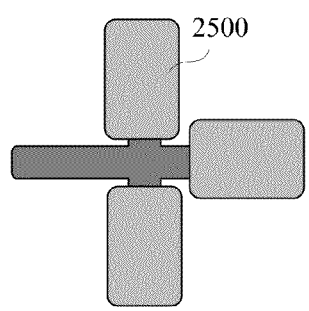
Figure 3E:
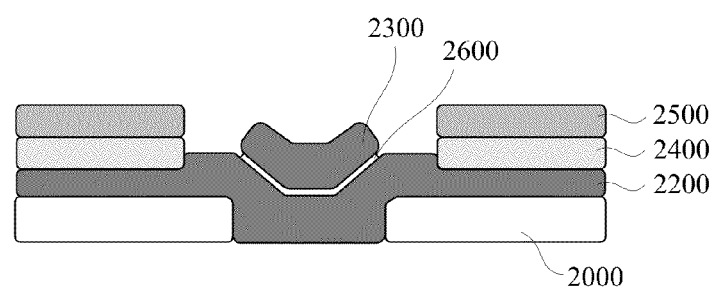
FIG. 3E is a cross-sectional view of a device made according to FIGS. 3A-3D when the silicon is doped from below.

FIGS. 3A-3D show an exemplary alternative embodiment in which the metal silicide may be agglomerated (or discontinuous). However, agglomeration is not necessarily required. In FIG. 3A, a doped dielectric 2000 is printed in regions where doped silicon is desired. As shown in FIG. 3B, the silicon island 2200 is then formed on the doped dielectric 2000, generally by printing a silicon precursor ink, drying the ink and curing the silicon precursor. The dopant is then diffused through substantially the entire thickness of the silicon island 2200 during a high temperature anneal step from the doped dielectric 2000 below. A gate dielectric 2600 (see FIG. 3E) can be formed on or over at least the channel region of the silicon island 2200, as described herein. A highly-doped silicon or metal gate 2300 is then formed, crossing over the channel region of the silicon island 2200, as shown in FIG. 3B. The silicide-forming metal precursor ink is printed onto the source and drain regions after the gate is printed, then dried, cured and annealed to form metal silicide regions 2400, as shown in FIG. 3C. Because the island 2200 was doped from below, the metal ink can be printed and used to form a silicide anywhere along the source and drain regions of the silicon island 2200, because this method provides relatively large regions of doped silicon. The metal interconnect 2500 can now be printed or otherwise formed anywhere on or above the metal silicide 2400, as seen in FIG. 3D. This method allows for added freedom in printing the metal interconnect as it is not required to print up to an edge of the spin-on dopant or interlayer dielectric, as shown in FIG. 2D. A cross-sectional view of a device manufactured according to this scheme (not drawn to scale) is shown in FIG. 3E.

In another process flow, the metal silicide is continuous. During the step of printing a silicon island or a gate, for example, a silicon ink can also be printed in areas of the substrate where a local interconnect is desired. Suitable formulations and methods for making the silicon ink (which may comprise one or more silanes, germanes, silagermanes, polysilanes, polygermanes, polysilagermanes, and/or silicon and/or germanium nanoparticles) can be found in U.S. Pat. Nos. 7,294,449 and 7,314,513, and U.S. patent application Ser. Nos. 10/616,147, 10/789,317, 10/950,373, 10/956,714, 11/373,460 and 11/867,587, filed on Jul. 8, 2003, Feb. 27, 2004, Sep. 24, 2004, Oct. 1, 2004, Mar. 10, 2006 and Oct. 4, 2007 respectively, the relevant portions of each of which are incorporated herein by reference. After printing the silane ink for the local interconnect (at the same time as either the silicon island or the gate), the doped dielectric may be printed or otherwise formed thereon, then the metal precursor ink can be deposited on exposed silicon regions (e.g., by spin-coating, spray-coating, or electroless deposition). After a silicidation anneal, metal silicide is formed in contact areas as well as in the exposed local interconnect areas. Naturally, this "continuous silicide" process also works when the doped dielectric layer is formed before the silicon island.

Figure 4A:
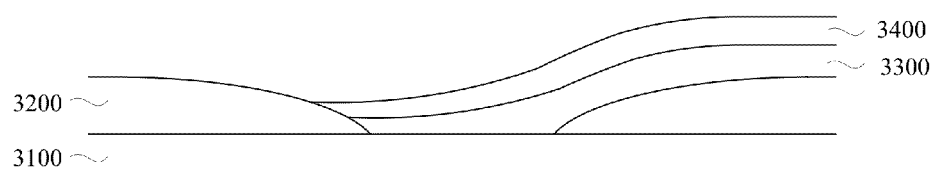
FIGS. 4A and 4B are cross-sectional views showing formation of a metal silicide interconnect according to the present invention.
Figure 4B:
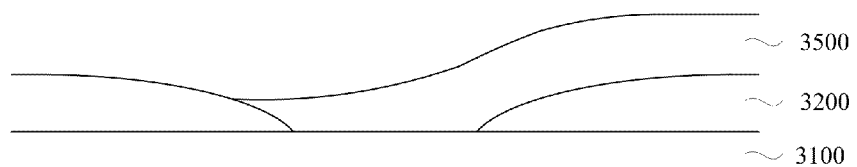

In another embodiment, as shown in FIG. 4A, a silicon layer 3300 may be formed (e.g., on dielectric layer 3200 and portions of an exposed substrate 3100) prior to selectively depositing the ink of a silicide-forming metal 3400 to provide the exposed silicon surface. In such an embodiment, the substrate 3100 may be comprised of any suitable material known in the art. For example, the substrate may comprise, but is not limited to, glass (e.g., quartz) sheets or slips, plastic and/or metal foils, sheets or slabs (e.g., aluminum or stainless steel foil; sheets or films of plastics such as polycarbonates, polyethylene and polypropylene esters, polyimides, etc.), silicon wafers, etc., all of which may further include one or more buffer layers (such as a polyimide or other polymer, silicon and/or aluminum oxide, etc.) thereon. The silicon layer 3300 may be formed by printing a silicon-containing ink, then drying and curing the silicon-containing ink. In such an embodiment, if the pattern formed by the metal precursor ink includes an interconnect pattern, the silicon-containing ink may be printed in an initial pattern that comprises the interconnect pattern. Furthermore, the initial pattern may further comprise one or more silicon islands. After drying (and optionally curing) the silicon layer 3300, a metal precursor ink may be printed thereon and dried to form metal precursor layer 3400. Optionally, the metal precursor layer 3400 may be reduced to form a metal film prior to silicidation. The structure of FIG. 4A may be heated (e.g., annealed) at a temperature and for a time sufficient to form a metal silicide interconnect (e.g., structure 3500 of FIG. 4B).

In preferred embodiments, the selectively deposited metal precursor ink forms a pattern having a minimum width of from 1 micron to about 200 microns, or any range of values therein (e.g., from 2 to about 100 microns). In various embodiments, the pattern has a maximum thickness from about 25 nanometers to about 10 microns, or any range of values therein (e.g., from 25 nanometers to about 1 micron). In a preferred embodiment, the pattern has a thickness over the exposed silicon surface sufficient to form the metal silicide and the remaining ink of the silicide-forming metal over the exposed silicon surface.

In various embodiments, to form the silicon contact, the metal precursor ink and silicon surface are heated to a first temperature for a length of time sufficient to form a metal silicide. The temperature range may be from 100° C. to about 1000° C. (e.g., from about 200° C. to about 700° C., or any range of values therein, such as from 250° C. to about 400° C.). The heating time to form the contact and/or interconnect may be from 1 minute to about 24 hours (e.g., from 2 minutes to about 240 minutes, or any range of values therein, such as from about 10 to about 120 minutes). Such conditions may allow silicidation to occur as part of a curing step (e.g., to dehydrogenate a silane polymer during formation of a silicon feature) or a solid phase crystallization step (e.g., at a temperature of from 550 to 900° C., and in one example, at about 600° C.).

In one embodiment, heating and reducing the metal precursor from the metal precursor ink may also form a metal in those areas where the metal precursor is not in contact with an exposed silicon surface. Preferably, the metal precursor is heated in an inert atmosphere, which may further comprise a reducing gas. In certain variations, the reducing gas comprises or consists essentially of hydrogen (e.g., $H_2$).

In some embodiments, the silicide-forming metal precursor ink may be optionally selectively deposited onto a dielectric layer adjacent to the exposed silicon surface to form an interconnect. In one preferred variation, via holes may be formed in the dielectric layer to expose the exposed silicon surface prior to selectively depositing the metal precursor ink. In other variations, the dielectric layer comprises a spin-on doped glass formulation, which may be printed to form the dielectric layer. In certain implementations (e.g., where the interconnect comprises a metal silicide), the spin-on doped glass formulation is selectively printed in a dielectric pattern that exposes the exposed silicon surface in the interconnect pattern and in the via holes.

In some variations, the metal from the reduced metal precursor not in contact with exposed silicon may form a seed layer. A bulk conductive metal may be selectively deposited onto the metal seed layer, for example by plating. Plating may comprise electroless plating, or in the alternative, electroplating the conductive metal. In one embodiment, electroless plating comprises immersing a substrate having silicon, a metal silicide on the surface thereof, and a dielectric material adjacent thereto having the seed layer thereon in a solution of a salt or complex of the bulk conductive metal at a temperature of from ambient temperature to 85° C. for a length of time sufficient to plate a predetermined thickness of the bulk conductive metal on the seed layer. In variations where the metal is deposited by electroplating, the substrate having the seed layer thereon is immersed in a solution of a salt or complex of the bulk conductive metal, and an electric potential is applied to the substrate and the solution for a length of time sufficient to plate a predetermined thickness of the bulk conductive metal on the functional material. Pd is a particularly useful metal for the seed layer, since nearly any other metal can be plated onto it.

In various embodiments, the bulk conductive metal is selected from the group consisting of Al, Ag, Au, Cu, Pd, Pt, Ni, Cr, Mo, W, Ru, Rh, and alloys/mixtures thereof. Preferably, the bulk conductive metal is Ag, Au, Cu, Ni, and/or Pd. In some implementations, the bulk conductive metal is annealed. Annealing may be conducted in a gas ambient that enables adjusting a resistance of the silicon contact and/or the bulk conductive metal. In exemplary embodiments, the gas ambient is selected from the group consisting of forming gas, $N_2$, Ar and mixtures thereof. In various embodiments, the bulk conductive metal is annealed at a temperature of at least 300° C. In other embodiments, the annealing temperature is not greater than 900° C. The bulk conductive metal may be annealed for a length of time of from about 1 second to about 24 hours, or any range of time therein (e.g., from about 2 minutes to about 240 minutes, 10 minutes to about 120 minutes, etc.).

In some exemplary implementations, portions of the ink of a silicide-forming metal may have varying thicknesses. For example, a first portion of the ink may have a first thickness and a second portion of the ink may have a second thickness, where the first and second thicknesses differ from one another. It is preferred to deposit a greater amount of the ink (e.g., thicker silicide-forming metal) where a lower line or sheet resistance is desired. Typically, a smaller amount of metal precursor ink is printed onto areas where contacts are desired, while a greater amount of metal precursor ink is printed in the interconnect portion of the pattern. The contact angle in which the ink is selectively deposited may be locally varied to provide different metal heights and/or line widths in the pattern. In certain embodiments, the thickness of the ink is independently controlled in each region (e.g., contacts to a source, a drain and/or a gate; formation of a relatively thick metal silicide layer on the gate, but thinner contact layers on the source/drain terminals; etc.).

In exemplary embodiments, the silicide-forming metal precursor ink formulation is selectively deposited onto source and drain contact regions and an entirety of a gate, and the silicide is formed on the gate simultaneously with source and drain contacts. In such embodiments, the gate may comprise amorphous silicon and/or polysilicon, and may be entirely converted to metal silicide by printing a thickness of the metal precursor ink large enough to entirely consume the silicon during the heating step. Alternatively, the gates may have a resistance that varies across the substrate (or region or portion thereof) by altering the thickness of the silicide-forming metal on different gates (e.g., when the polycrystalline and/or amorphous silicon gates have a substantially consistent thickness). In other embodiments, the gates may have a resistance that varies across the substrate (or region or portion thereof) by altering the thickness of the silicon layer for the gates, then depositing the silicide-forming metal on different gates at a substantially consistent thickness. When the resistivity of the gates across a substrate is varied (e.g., by altering the thickness of the metal precursor layer or film and forming a metal silicide from substantially all of the metal precursor over the exposed silicon surface), one may provide a variety of different transistors having different work functions, and thus, different functionalities.

In one embodiment, at least one portion of the ink (or of the metal precursor resulting from drying the ink) has a greater thickness than at least one other portion of the ink (or metal precursor). In this embodiment, the greater thickness is sufficient to reduce line thinning and/or line breaking relative to the other portion(s).

In some embodiments, the process flow does not rely on the continued presence of a doped dielectric over the device, for possible use as an interlayer dielectric. For example, in one variation, the dopant (e.g., a conventional liquid phase dopant, in a polymeric binder or carrier such as a polyimide and a solvent) is screen printed on the exposed silicon surface, and the dopant is diffused into the silicon during an activation step (for example, a high temperature anneal step). The activation step temperature can range from 700-1000° C., and the annealing ambient (e.g., atmosphere) can comprise $N_2$, $O_2$, forming gas, or a combination thereof, in a vacuum or at ambient pressure. During this high temperature anneal, the screen printed dopant can advantageously burn off, leaving behind only the dopant atoms or other dopant source material to diffuse the dopant (P, B, As, etc.) into the underlying silicon. Optionally, any carbon and/or oxygen residue left behind after the activation step can be cleaned off using an oxygen plasma (e.g., by ashing) or using a conventional wet etch (e.g., an aqueous $H_2SO_4/H_2O_2$ [Piranha] etch). In this scheme, both the oxygen plasma and the wet etch are compatible with the transistor fabrication process; neither process adversely impacts the gate oxide, silicon channel, or the gate when it comprises or consists essentially of polysilicon. In this process, the silicon is doped, but no oxide or interlayer dielectric remains. In the alternative, where the screen printed or spin-on dopant stays in place after activation, it can be removed by conventional processes, such as lithography and wet or dry etching to create via and/or contact openings. This process is effective for forming metal silicide contacts.

However, in the absence of an oxide on the surface of the substrate, it may not be possible to selectively wet the (doped or undoped) silicon surface relative to the oxide. Thus, when the metal precursor ink must adhere to those surfaces on which it is printed. In this way, contacts and interconnects (or metal seed layers) can be formed in a single step. Where an interconnect and/or seed layer is desired, an interlayer dielectric layer may be deposited after forming the silicide by conventional methods known in the art. Contact holes may also be formed in the interlayer dielectric, and one or more metallization layers (e.g., for the interconnect) may be formed in the contact holes and on the interlayer dielectric as described herein and/or as is known in the art.

Exemplary Methods of Making a Transistor

Figure 5A:
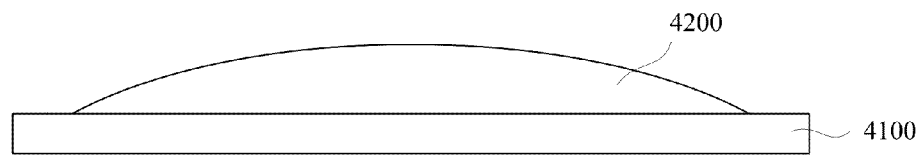
FIGS. 5A-5H are cross-sectional views of a transistor made according to a method of the present invention.
Figure 5B:
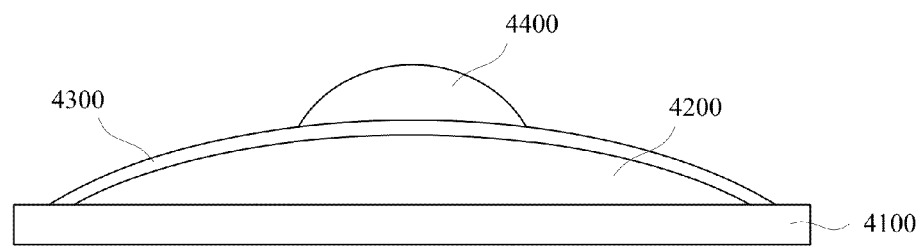
Figure 5C:
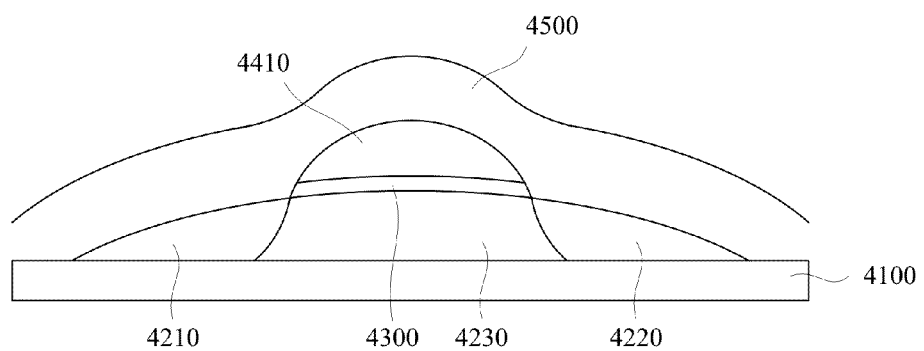
Figure 5D:
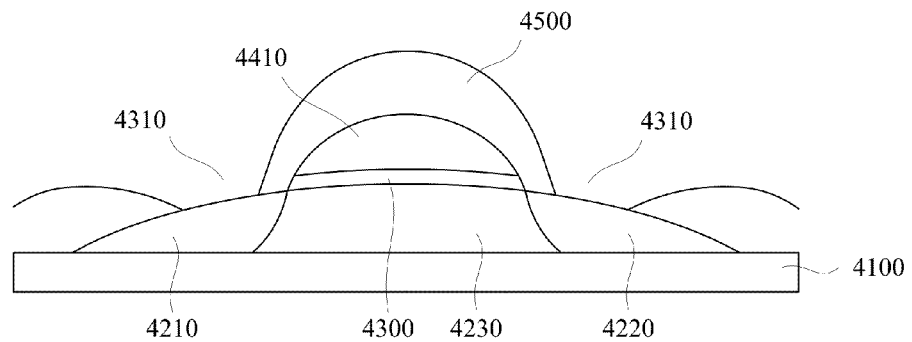
Figure 5E:
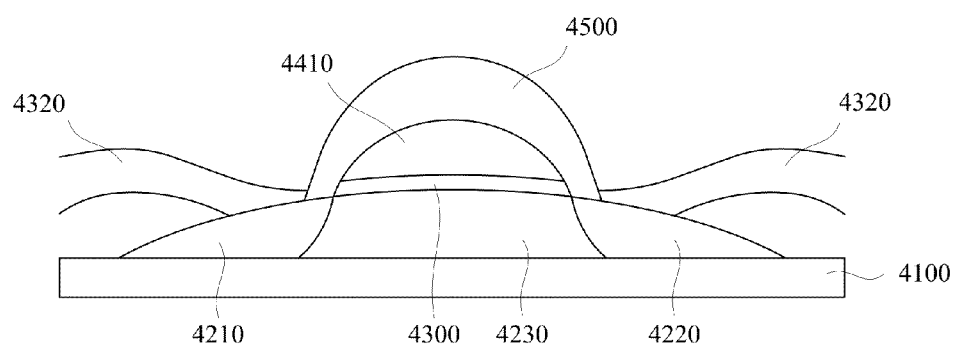
Figure 5F:
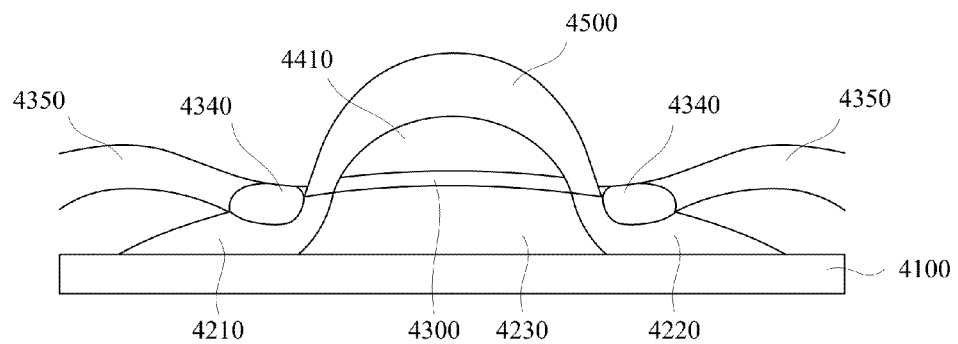

Another aspect of the present invention relates to methods of making a transistor, the steps of which are illustrated in FIGS. 5A-5F. In general, a semiconductor layer (e.g., silicon) 4200 is formed on a substrate 4100. Subsequently, as shown in FIG. 5B, a gate dielectric (e.g., formed by wet or dry thermal oxidation, gas-phase deposition [e.g., CVD, PECVD, HDP-CVD, etc.] or liquid-phase deposition [e.g., see copending U.S. patent application Ser. Nos. 11/452,108, 11/818,078, 11/888,942, 11/888,949, 11/842,884 and 12/109,338, filed on Jun. 12, 2006, Jun. 12, 2007, Aug. 3, 2007, Aug. 3, 2007, Aug. 21, 2007, and Apr. 24, 2008, respectively, the relevant portions of which are incorporated herein by reference) 4300 is formed on the semiconductor layer, and a gate 4400 is formed thereon. Portions of the gate dielectric layer 4300 exposed by the gate 4400 are then removed. As illustrated in FIG. 5C, a doped dielectric layer 4500 is patterned or blanket deposited on the substrate, including the semiconductor layer 4200 and gate 4400. The substrate and the structures thereon are subsequently heated to diffuse the dopant into regions of the semiconductor layer 4200, thereby forming source and drain terminals 4210 and 4220. While regions of the semiconductor layer are now doped (e.g., structures 4210 and 4220), a portion of the channel region 4230 in the semiconductor layer remains undoped. If the gate 4400 comprises silicon, the dopant will diffuse from doped dielectric 4500 into the gate 4400, forming the doped gate structure 4410 as shown in FIG. 5C. In some embodiments, as illustrated in FIG. 5D, the doped dielectric layer 4500 remains on the structure, and via holes 4310 are formed therein. Alternatively, the via holes may be formed by printing the doped dielectric in a pattern that includes the via holes. A metal precursor ink is deposited onto the exposed silicon surface and on the adjacent dielectric layer, and the ink is dried to form a silicide-forming metal precursor 4320, as shown in FIG. 5E. The silicide-forming metal precursor 4320 is then cured and/or reduced to form metal interconnect 4350, and the (reduced) silicide-forming metal precursor in contact with the exposed silicon surface (e.g., source/drain terminals 4210 and 4220) is then heated to form silicon contacts 4340, as shown in FIG. 5F.

In alternative embodiments, the doped dielectric layer 4500 may be removed before depositing the metal precursor ink. In one variation, the doped dielectric layer 4500 comprises an organic material that is relatively combustible, such as a polyamide, acrylic, or poly(ethylene oxide). In this instance, the doped dielectric layer 4500 in FIG. 5C may be "burned off" by heating in a high temperature atmosphere, as previously described herein, to form a precursor to the structure shown in FIG. 5G. Alternatively, the doped dielectric layer 4500 can be removed using methods (such as wet etching) as described herein.

Figure 5G:
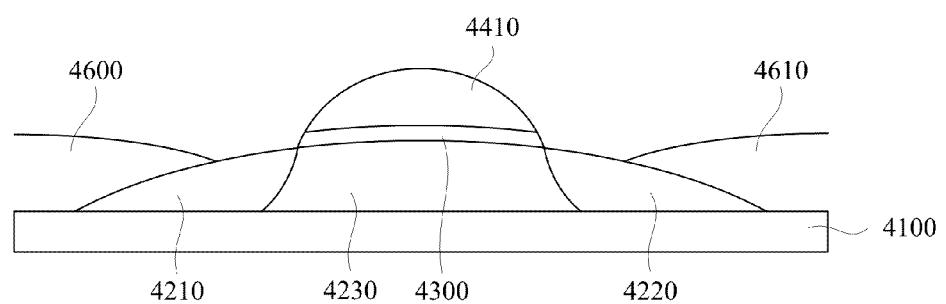
Figure 5H:
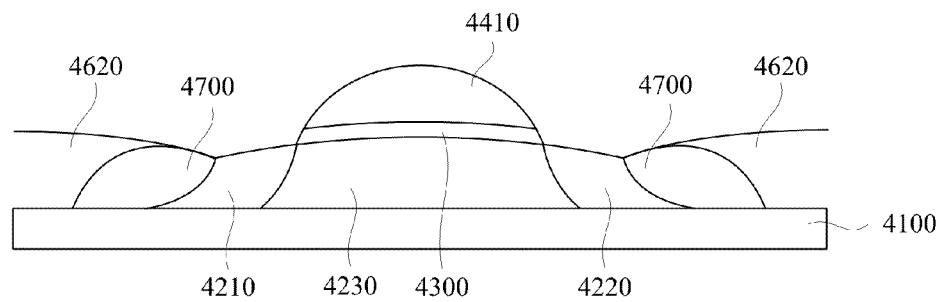

Referring to FIG. 5G, in an alternative embodiment, an ink containing a silicide-forming metal may be printed on the exposed portions of the substrate 4100 and the doped source and drain terminals 4210 and 4220. The ink is dried to form a silicide-forming metal precursor (e.g., structures 4600 and 4610). The metal precursor and the silicon surface in contact with the precursor (e.g., portions of source and drain terminals 4210 and 4220) may be annealed to form metal silicide edge contacts 4700 and metal interconnect 4620, as shown in FIG. 5H. In exemplary embodiments, the ink contains a silicide-forming metal precursor and a solvent. Preferably, the silicide-forming metal precursor comprises Pd.

Optionally, an interlayer dielectric may be deposited onto the gate and the semiconductor layer. The ink containing a silicide-forming metal may then be printed on portions of the continuous semiconductor layer and the gate that are exposed by the interlayer dielectric. Additionally, the ink may also be printed on areas of the interlayer dielectric adjacent to the exposed areas of the semiconductor layer and the gate, either with or without further surface energy modification of the interlayer dielectric prior to printing. The ink may be subsequently dried to form a silicide-forming metal precursor, which then may be heated sufficiently to form a metal seed layer or interconnect on the interlayer dielectric (in addition to the metal silicide formed on the exposed areas of the semiconductor layer and the gate).

In the above described embodiments, the gate dielectric may be formed by thermal oxidation. In the alternative, the gate dielectric may be formed by printing or coating a liquid-phase dielectric precursor. In one variation, the continuous semiconductor layer is formed by printing a liquid-phase ink containing a silicon and/or germanium precursor in a pattern onto the substrate. In such a variation, the silicon and/or germanium precursor comprises an ink containing a hydrosilane, hydrogermane, hydrosilagermane, (cyclo)silane, (cyclo)germane, (cyclo)silagermane, (poly)silane, (poly)germane, and/or (poly)silagermane, and/or silicon and/or germanium nanoparticles (see, e.g., U.S. patent application Ser. Nos. 10/616,147, 10/789,317, 10/950,373, 10/956,714, 11/373,460, and 11/867,587, filed on Jul. 8, 2003, Feb. 27, 2004 Sep. 24, 2004, Oct. 1, 2004, Mar. 10, 2006 and Oct. 4, 2007, respectively, the relevant portions of each of which are incorporated herein by reference).

In one implementation, the step of forming the gate may further include forming an interconnect pattern. In some variations, the gate and/or interconnect pattern may be formed by printing a liquid-phase silicon and/or germanium precursor (e.g., an ink containing a (poly)silane and/or (poly)germane) over the semiconductor layer and the gate dielectric. As described with regard to previous embodiments and variations, a metal interconnect precursor may be printed, or the metal interconnect may be plated on a printed interconnect pattern (which may comprise a printed metal seed layer, a metal silicide layer, or doped semiconductor layer). Preferably, the metal interconnect is electrolessly plated on the metal seed layer.

Exemplary Methods of Making Diodes

Additional aspects of the present invention relate to diodes and other devices formed from the above-described contacts and/or interconnects. Printed metal inks may be useful for making coupled contacts, in which either the source and gate or the drain and gate of a printed transistor are electrically connected to form a diode. Alternatively, as explained above, the source and drain may be electrically connected to form a capacitor. Other devices, such as resistors, can be formed as described herein. Inductors may be formed by printing a coil or serpentine pattern onto a dielectric or other insulative surface over (semi)conductive features such as electrical circuitry, and exposing two silicon surface portions (e.g., in the circuitry under the dielectric or other insulation layer) to which a metal silicide contact is formed in accordance with the present invention.

Figure 6A:
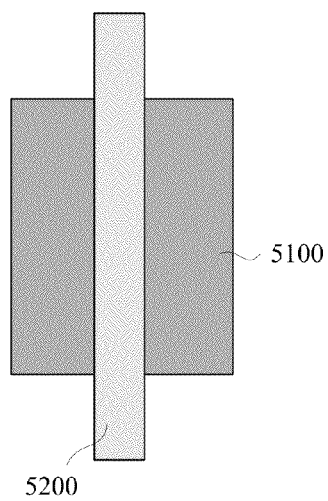
FIGS. 6A-6C are top-down views showing a diode made according to a method of the present invention.
Figure 6B:
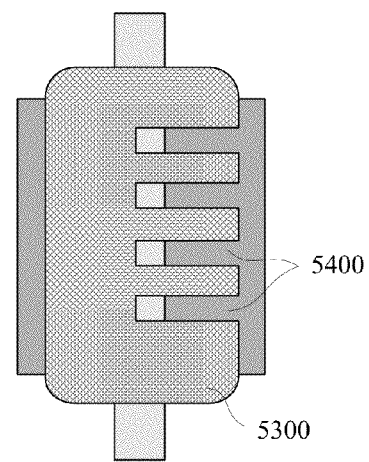
Figure 6C:
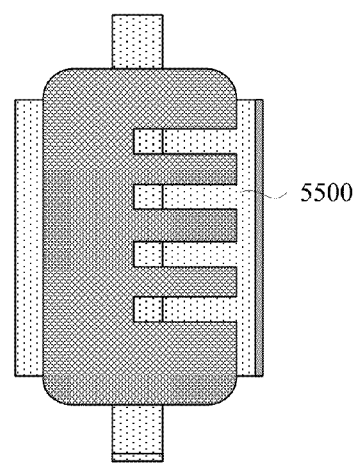

In this case, a metal is printed or selectively deposited onto the contact areas, as well as onto the field oxide and/or interlayer dielectric, to make the appropriate connection(s). If a polysilicon gate is used for a diode-wired thin film transistor, its resistivity should be lowered to increase the frequency at which it operates. To achieve this result, a diode may be formed according to FIGS. 6A-6C. FIG. 6A shows a printed silicon island 5100 and gate 5200. In FIG. 6B, a doped dielectric layer 5300 may be printed over the gate and source/drain regions in a predetermined pattern, leaving spaces or openings 5400 for metal silicide straps to connect the gate to a source/drain terminal. As shown in FIG. 6C, a metal layer 5500 can then be formed (e.g., by printing or blanket deposition) in the openings 5400 of the dielectric layer 5300. By using surface energy modification, as earlier described, the metal ink will wet or print on primarily or only the exposed areas of silicon layers 5100 and 5200, leaving the dielectric 5300 uncovered. After a silicidation step is completed, the gate is now connected to one side of the island in multiple places, and the thin film transistor acts as a diode. The advantage of using multiple straps is that the gate resistivity is lowered, thereby allowing for the diode to operate at a higher frequency. The steps in the method for forming a diode and exemplary variations of the same are discussed in more detail below.

According to a general method, a gate dielectric is formed on an exposed silicon surface (e.g., 5100 in FIG. 6A) on a substrate. A gate (e.g., 5200 in FIG. 6A) is then formed on the gate dielectric. Next, a patterned doped dielectric (e.g., 5300 in FIG. 6B) containing a dopant is formed on at least parts of the exposed silicon surface. The dopant is then diffused into regions of the silicon layers 5100 and 5200 within a diffusion distance of the patterned, doped dielectric 5300. An ink comprising a silicide-forming metal is printed on at least the exposed, portions of the silicon surface and subsequently dried to form a silicide-forming metal precursor. The metal precursor and the silicon surface in contact with the metal precursor are heated sufficiently to form a metal silicide layer. In areas other than those in contact with exposed silicon, the silicide-forming metal precursor forms a metal that serves as a local interconnect in such devices.

The silicon surface of a diode made according to the above-described general method may comprise a first silicon island.

In some embodiments, the gate comprises polysilicon, and heating the metal precursor and the silicon surface further heats the metal precursor and the gate sufficiently to form the metal silicide layer on (and/or from) the gate. In preferred embodiments, the patterned doped dielectric comprises a spin-on doped dielectric formulation. In such embodiments, the spin-on doped dielectric is formed (or printed) in a pattern having spaces or openings therein for a plurality of metal silicide straps to connect the gate to the doped regions of the silicon. In exemplary embodiments, the silicide-forming metal comprises Pd.

Exemplary Diodes

Various diodes may be formed according to the methods described above. In one embodiment, a diode comprises a substrate with a silicon surface and has a metal silicide layer on at least part of the silicon surface. The diode further comprises a metal seed layer on or over the substrate, which is continuous with the metal silicide layer, and is in a pattern of an interconnect. A bulk conductive metal is plated on the metal silicide layer and the metal seed layer to form the interconnect. In some implementations, the metal seed layer may be printed, as described herein. In exemplary embodiments, the metal seed layer comprises a seed metal selected from the group consisting of Pd, Pt, Ni, Cr, Mo, W, Ru, Rh, Ti, and alloys and mixtures thereof. However, Pd is preferred, since almost all other metals will selectively plate onto Pd. Advantageously, the metal silicide comprises a palladium silicide and/or the seed metal consists essentially of $Pd_2Si$. The bulk conductive metal may be selected from the group consisting of Al, Ag, Au, Cu, Pd, Pt, Ni, Cr, Mo, W, Ru, Rh, and alloys thereof. In preferred embodiments, the bulk conductive metal comprises Ag, Au, Cu, or Pd. Alternatively or additionally, the bulk conductive metal may consist essentially of Ag or Cu.

In a second embodiment relating to a diode, a gate is formed on or over a gate dielectric on the silicon surface of a substrate. The diode further comprises a patterned, doped dielectric containing a dopant. The dopant is present in regions of the substrate under the patterned, doped dielectric, and is substantially absent in regions of the substrate exposed by the patterned, doped dielectric. The diode has a metal silicide layer on the gate and on at least part of a source/drain terminal in or on the silicon surface. A metal seed layer is formed on or over the substrate and is continuous with both the metal silicide layer on the gate and the metal silicide layer on at least part of a source/drain terminal. There are many variations of this general embodiment. For example, the silicon surface may comprise a first silicon feature and/or the gate may comprise polysilicon. In other variations, the doped dielectric comprises a spin-on dopant, having spaces or openings therein for a plurality of metal silicide straps, which connect the gate to the source/drain terminal. In preferred embodiments, the metal silicide is Pd silicide.

Exemplary Electrical Devices

Figure 7A:
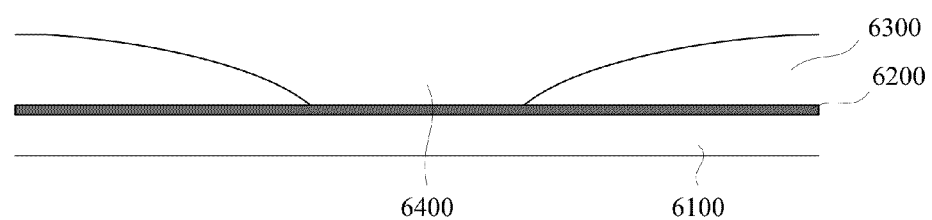
FIGS. 7A and 7B are cross-sectional views of an electrical device made with a metal contact and/or interconnect according to the present invention.
Figure 7B:
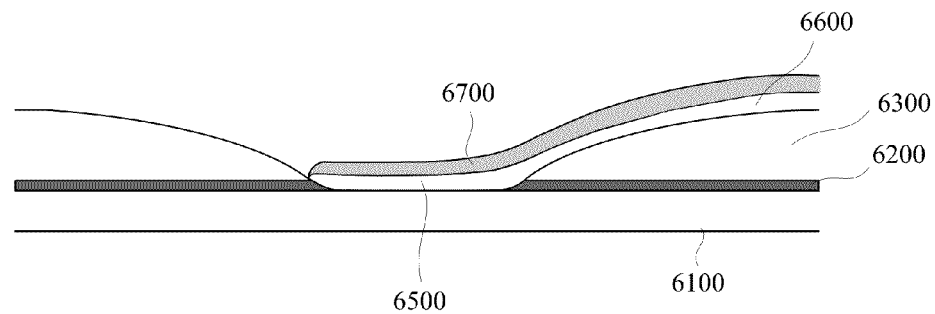

A further aspect of the present invention concerns an electrical device made from contacts and/or interconnects according to the present invention. As shown in FIG. 7A, in one general embodiment, the electrical device comprises a substrate 6100 having a silicon surface 6200 thereon, and a dielectric material 6300 having a via hole 6400, which exposes part of the silicon surface. As shown in FIG. 7B, the device has a metal silicide layer 6500 in the via hole 6400 on the exposed silicon surface 6200, and the electrical device has a metal seed layer 6600 on the dielectric material, which is continuous with the metal silicide layer. The metal seed layer is in a pattern of an interconnect. The device further has a bulk conductive metal 6700 plated on the metal silicide layer and the metal seed layer to form the interconnect. The seed metal may be selected from the group consisting of Pd, Pt, Ni, Cr, Mo, W, Ru, Rh, Ti, and alloys and mixtures thereof. Preferably, the seed metal comprises Pd. In preferred embodiments, the metal silicide is a palladium silicide and/or the seed metal consists essentially of $Pd_2Si$. In some variations, the metal seed layer may be formed by printing (e.g., on the dielectric layer). In exemplary implementations, the bulk conductive metal is selected from the group consisting of Al, Ag, Au, Cu, Pd, Pt, Ni, Cr, Mo, W, Ru, Rh, and alloys/mixtures thereof. In preferred embodiments, the bulk conductive metal is Ag, Au, Cu, or Pd.

WORKING EXAMPLES

Formation of Contacts and Local Interconnects

The feasibility of metal silicide as a contact material was demonstrated with evaporated Pd. Palladium silicide ($Pd_2Si$) formation overcame the presence of a surface oxide on the silicon and formed low resistance ohmic contacts to conventional and spincoated silicon films, thereby alleviating the need for special cleaning (e.g., a sputtering process) to clean contaminants from the silicon surface. The reaction between Pd and Si occurred at 300° C. in $N_2$ or $Ar/H_2$ as confirmed by x-ray diffraction, cross section SEM, and four point probe measurements. Functional via chains (contacts) using $Pd_2Si$ and Al interconnects were similarly demonstrated. Contact resistances in this case were about $10^{-6}$ ohm-cm$^2$.

CONCLUSION/SUMMARY

Thus, the present invention provides methods of forming contacts by selectively depositing and subsequently forming a metal silicide, and optionally forming local interconnects using the same selective deposition process. The invention also relates to electrical devices such as diodes and/or transistors made from such printed contacts and/or local interconnects, and to methods for forming such devices. Printing a metal ink for contacts as well as for local interconnects at the same time reduces or eliminates disadvantages of conventional processes. For example, this approach advantageously reduces the number of printing steps and does not require any etching steps. Variations of the present invention provide flexibility for situations where a different metal is desired for the interconnect lines. In such situations, printed metal may serve as a seed for electroless deposition or other metals, as well as for the metal silicide in the contact areas.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of making a structure, comprising:
   a) depositing an ink containing a silicide-forming metal onto (i) an exposed silicon surface of a semiconductor layer and (ii) a dielectric layer adjacent to the exposed silicon surface; and b) heating the silicide-forming metal and the silicon surface to form a metal silicide contact and a metal interconnect or a seed layer on the dielectric layer.

2. The method of claim 1, wherein the ink comprises a silicide-forming metal precursor and a solvent.

3. The method of claim 2, wherein the metal precursor comprises a metal selected from the group consisting of Pd, Pt, Ni, Cr, Mo, W, Ru, Rh, Ti, and mixtures thereof.

4. The method of claim 3, wherein the metal precursor comprises a salt or complex of said metal.

5. The method of claim 3, wherein the ink further comprises one or more additives that form gaseous or volatile byproducts upon reduction of the metal salt or metal complex to an elemental metal or alloy.

6. The method of claim 3, wherein the ink further comprises a bulk conductor precursor comprising nanoparticles and/or one or more salts, oxides and/or complexes of a bulk conductor metal.

7. The method of claim 6, wherein the bulk conductive metal is plated from a salt or complex of the bulk conductive metal.

8. The method of claim 1, further comprising forming the semiconductor layer on a substrate.

9. The method of claim 8, wherein forming the semiconductor layer comprises printing an ink containing silicon and/or germanium precursor in a pattern onto a substrate.

10. The method of claim 1, further comprising:
a) forming a gate dielectric on the semiconductor layer; and
b) forming a gate on the gate dielectric, where at least one of the gate and the semiconductor layer comprises elemental silicon.

11. The method of claim 10, wherein the dielectric layer exposes part of the semiconductor layer, and the method further comprises diffusing a dopant into the semiconductor layer.

12. The method of claim 11, wherein the dielectric layer contains the dopant.

13. The method of claim 12, wherein the doped dielectric has spaces or openings therein for at least one conductive strap to connect the gate to a doped region of the semiconductor layer.

14. The method of claim 10, wherein forming the gate comprises printing an ink containing silicon and/or germanium precursor in a pattern over the semiconductor layer.

15. The method of claim 10, wherein the gate comprises polysilicon, and the ink of the silicide-forming metal and the gate are heated sufficiently to form the metal silicide layer on the gate.

16. The method of claim 15, wherein the silicide-forming metal is on the gate and on at least part of the silicon surface, thereby forming a diode.

17. The method of claim 16, wherein the seed layer is continuous with both the metal silicide layer on the gate and the metal silicide layer on at least part of the silicon surface.

18. The method of claim 1, wherein heating the silicide-forming metal forms the seed layer, and the method further comprises selectively depositing a bulk conductive metal on the seed layer.

19. The method of claim 18, wherein selectively depositing the bulk conductive metal comprises plating the bulk conductive metal onto the metal seed layer.

20. The method of claim 19, wherein the bulk conductive metal is selected from the group consisting of Al, Ag, Au, Cu, Pd, Pt, Ni, Cr, Mo, W, Ru, Rh, and alloys thereof.

21. The method of claim 20, wherein the bulk conductive metal is plated on the metal silicide layer and the metal seed layer to further form the interconnect.

22. The method of claim 1, wherein heating the silicide-forming metal forms the seed layer, and the seed layer and the silicide-forming metal comprise Pd.

23. The method of claim 1, comprising selectively depositing the ink containing the silicide-forming metal to form a pattern.

24. A method of making a device, comprising:
a) forming a patterned doped dielectric on a substrate, the patterned doped dielectric containing a dopant;
b) forming a continuous semiconductor layer on least part of adjacent structures in the patterned doped dielectric and a gap between the adjacent structures;
c) forming a gate dielectric on the continuous semiconductor layer, at least over the gap;
d) diffusing the dopant into regions of the continuous semiconductor layer within a diffusion distance of the patterned, doped dielectric;
e) forming a gate on the gate dielectric;
f) printing an ink comprising a silicide-forming metal on exposed portions of the continuous semiconductor layer; and
g) drying the ink and heating the silicide-forming metal and a silicon surface in contact therewith sufficiently to form a metal silicide layer, at least one of the continuous semiconductor layer and the gate comprising the silicon surface.

25. The method of claim 24, wherein forming the continuous semiconductor layer comprises printing an ink containing a silicon and/or germanium precursor.

26. The method of claim 24, wherein forming the gate comprises printing an ink containing a silicon and/or germanium precursor.

27. The method of claim 24, further comprising depositing an interlayer dielectric onto the gate and the semiconductor layer.

28. The method of claim 27, further comprising printing an ink comprising a silicide-forming metal on exposed portions of the continuous semiconductor layer and the gate.

29. The method of claim 28, further comprising drying the ink and heating the silicide-forming metal sufficiently to form a metal seed layer or interconnect on the interlayer dielectric.

* * * * *